(12) United States Patent
Wang et al.

(10) Patent No.: US 10,832,913 B2
(45) Date of Patent: Nov. 10, 2020

(54) METHOD AND APPARATUS FOR FORMING SEMICONDUCTOR STRUCTURE

(71) Applicant: TAIWAN SEMICONDUCTOR MANUFACTURING COMPANY LTD., Hsinchu (TW)

(72) Inventors: Tsan-Chun Wang, Hsinchu (TW); Chiao-Ting Tai, New Taipei (TW); Che-Fu Chiu, New Taipei (TW); Chun-Feng Nieh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/896,565

(22) Filed: Feb. 14, 2018

(65) Prior Publication Data

US 2019/0252192 A1 Aug. 15, 2019

(51) Int. Cl.
  *H01L 21/265* (2006.01)
  *H01L 21/3215* (2006.01)
  *H01L 21/324* (2006.01)
  *H01J 37/32* (2006.01)
  *H01J 37/30* (2006.01)

(52) U.S. Cl.
  CPC ............ *H01L 21/265* (2013.01); *H01J 37/30* (2013.01); *H01J 37/321* (2013.01); *H01J 37/32422* (2013.01); *H01L 21/324* (2013.01); *H01L 21/32155* (2013.01)

(58) Field of Classification Search
  None
  See application file for complete search history.

(56) References Cited

U.S. PATENT DOCUMENTS

| | | | |
|---|---|---|---|
| 5,137,838 A * | 8/1992 | Ramde | H01L 21/2205 438/499 |
| 10,378,084 B2 * | 8/2019 | Akashi | B01J 19/2415 |
| 2003/0193066 A1 * | 10/2003 | Ito | H01L 21/26506 257/335 |
| 2004/0016404 A1 * | 1/2004 | Gregg | C23C 16/4481 118/726 |
| 2004/0056210 A1 * | 3/2004 | Scherer | G04F 10/00 250/492.1 |
| 2006/0073673 A1 * | 4/2006 | Verhaverbeke | H01L 21/02052 438/455 |
| 2006/0219938 A1 * | 10/2006 | Huang | H01J 37/08 250/432 R |
| 2010/0255198 A1 * | 10/2010 | Cleary | C23C 16/4402 427/255.39 |
| 2013/0313971 A1 * | 11/2013 | Biloiu | H01J 37/08 315/111.21 |
| 2017/0213889 A1 * | 7/2017 | Gluschenkov | H01L 29/0847 |

* cited by examiner

*Primary Examiner* — Thien F Tran
(74) *Attorney, Agent, or Firm* — WPAT, P.C., Intellectual Property Attorneys; Anthony King

(57) ABSTRACT

A method for forming a semiconductor structure comprises heating a solid material to form a gaseous substance; ionizing the gaseous substance to produce a first type of ions; and implanting the first type of ions into a semiconductor substrate. The method can achieve better abruptness, better shallow junction depth, and better sheet resistance.

20 Claims, 9 Drawing Sheets

METHOD AND APPARATUS FOR FORMING SEMICONDUCTOR STRUCTURE

BACKGROUND

As the semiconductor industry has progressed into nanometer technology, the trend is toward smaller and higher speed devices. In particular, the depths of junctions in semiconductor devices are decreasing. Thus, ion implantation is used to introduce conductivity-altering solid materials into semiconductor wafers in pursuit of higher device density.

However, current approaches used in the art do not provide a process for fabricating shallow junctions/ultra-shallow junctions with satisfactory abruptness, junction depth and sheet resistance. Accordingly, a need exists for improved methods for fabricating shallow junctions/ultra-shallow junctions in semiconductor wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
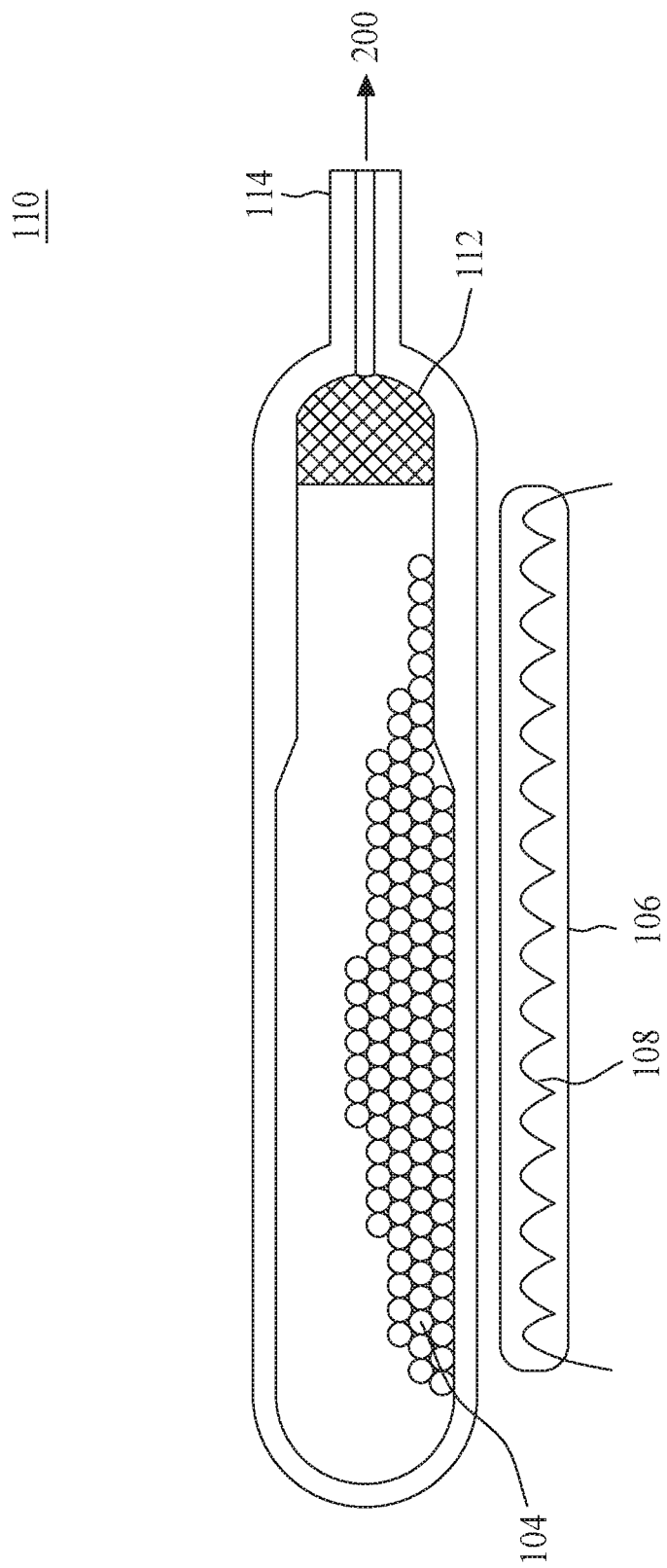
FIG. 1A illustrates a heating chamber for implementing a method for applying a Pre-Amorphization-Implant (PAI) in a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure aims to provide improved methods and apparatus for fabricating shallow junctions/ultra-shallow junctions in semiconductor structures.

FIG. 1A illustrates a heating chamber 110 for implementing a method for applying a Pre-Amorphization-Implant (PAI) in a semiconductor structure in accordance with some embodiments of the present disclosure. The PAI process is utilized to meet the dopant profile requirement to achieve projection range control, and precise junction depth.

Referring to FIG. 1A, the solid material 104 is powder of dopant material. The solid material 104 is heated in a heating chamber 110 by a filament 108 of a heater 106. The filament 108 of the heater 106 in the heating chamber 110 is given a high voltage to increase the temperature inside the heating chamber 110. After the temperature of the solid material 104 increases over a vaporization temperature or a sublimation temperature of the solid material 104, the gaseous substance is generated in the heating chamber 110. Finally, the gaseous substance can be extracted through the crucible nozzle 114 to the ion implanter 200. Such extraction can be executed by a conventional ion implanter source head, and the gaseous substance in the heating chamber 110 can be further filtered by a quartz wool 112.

Figure 1B:
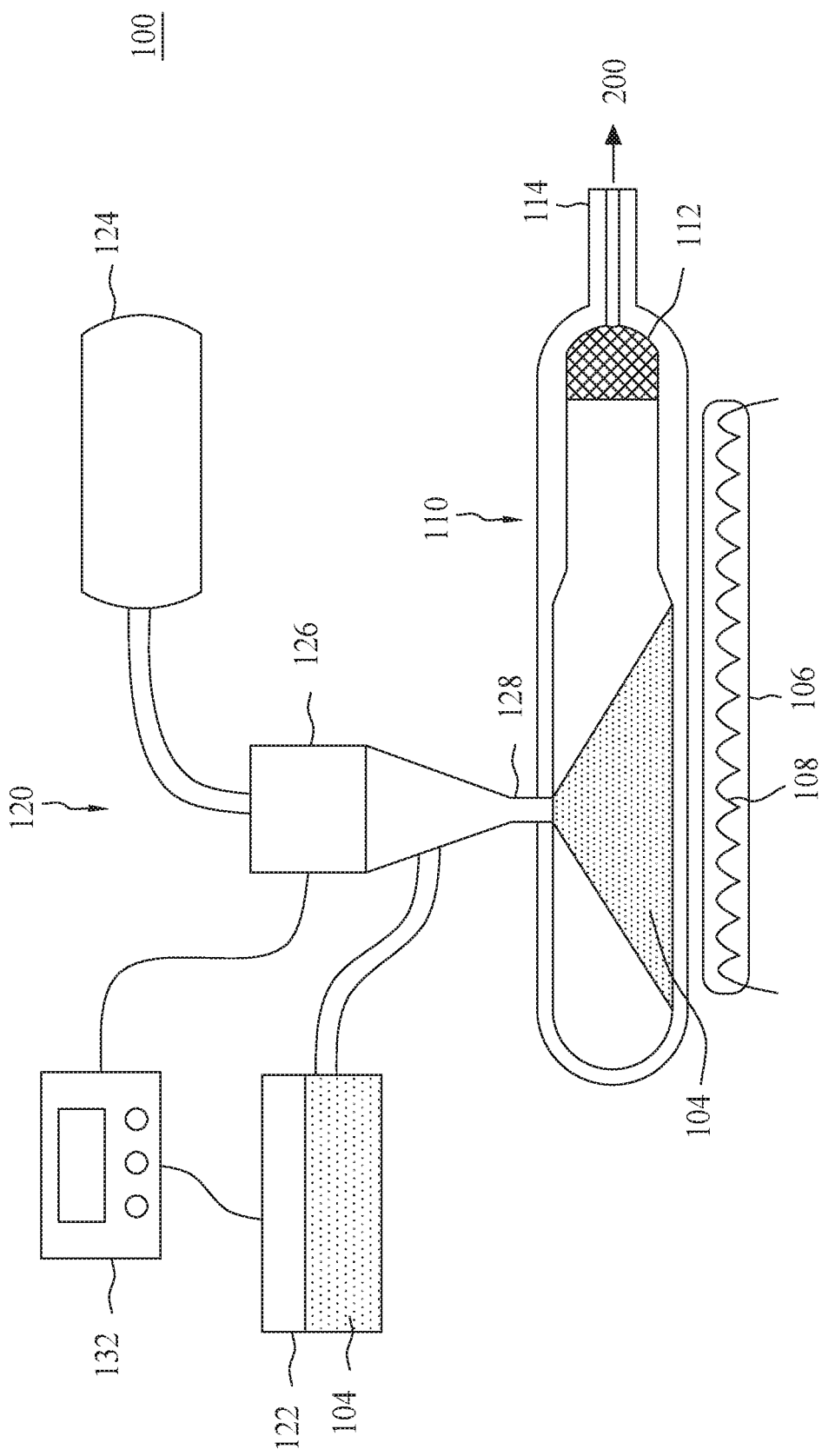
FIG. 1B illustrates a heating system for implementing a method for applying a PAI in a semiconductor structure in accordance with some embodiments of the present disclosure.

FIG. 1B illustrates a heating system 100 for implementing a method for applying a PAI in a semiconductor structure in accordance with some embodiments of the present disclosure. The heating system 100 is required to heat the solid material 104 before the solid material 104 is introduced into an ion implanter 200 because the solid material 104 is in the solid state in the normal temperature and pressure, and the ion implanter 200 can ionize the gaseous substance rather than the solid substance.

Referring to FIG. 1B, the heating system 100 includes a heating chamber 110 of FIG. 1B and a feeder 120. The feeder 120 feeds the solid material 104 into the heating chamber 110. The feeder 120 comprises a material storage 122, a mixing chamber 126, a compressor 124, a controller 132, and a jetting nozzle 128. The solid material 104 is stored in the material storage 122, and the controller 132 is used for controlling the rate that the material storage 122 releases the solid material 104 into the mixing chamber 126, and the compressor 124 blows the air into the mixing chamber 126. The powder of the solid material 104 is driven by the air blown by the compressor 124 and is jetted into the heating chamber 110 through the jetting nozzle 128. The air can be Argon to avoid oxidation of the solid material 104.

The solid material 104 can be the solid Gallium compound, for example, Gallium Iodide ($GaI_3$), and can be powder packed under Argon. In the traditional process of the semiconductor industry, Indium is utilized as the solid material. However, Indium has lower activation, and may results in clustering at high dose. On the contrary, Gallium has higher activation than Indium, and also excellent activation in Germanium. Such properties make Gallium a better p-type dopant than Indium. In other words, Gallium can additionally modify the electronic properties of the semiconductor structure by contributing the electrons while serving as the solid material for the P-Type implanting target.

In the conventional process, Boron is also utilized as the solid material. However, Boron results in higher ion straggling, diffusion and scattering, and may cause engineering damage. On the contrary, Gallium has higher mass than Boron, and such property leads to reduce ion straggling. Moreover, Gallium is a slow diffuse in Germanium since the equilibrium diffusion coefficient is about 0.007 $nm^2/s$ at 650° C. and the maximum solid solubility of Gallium is $4.9 \times 10^{20}$ $cm^{-3}$ at 670° C. Further, Gallium can complete Germanium amorphization during high fluencies implantation, and Gallium can reduce scattering and engineering damage.

Figure 2:
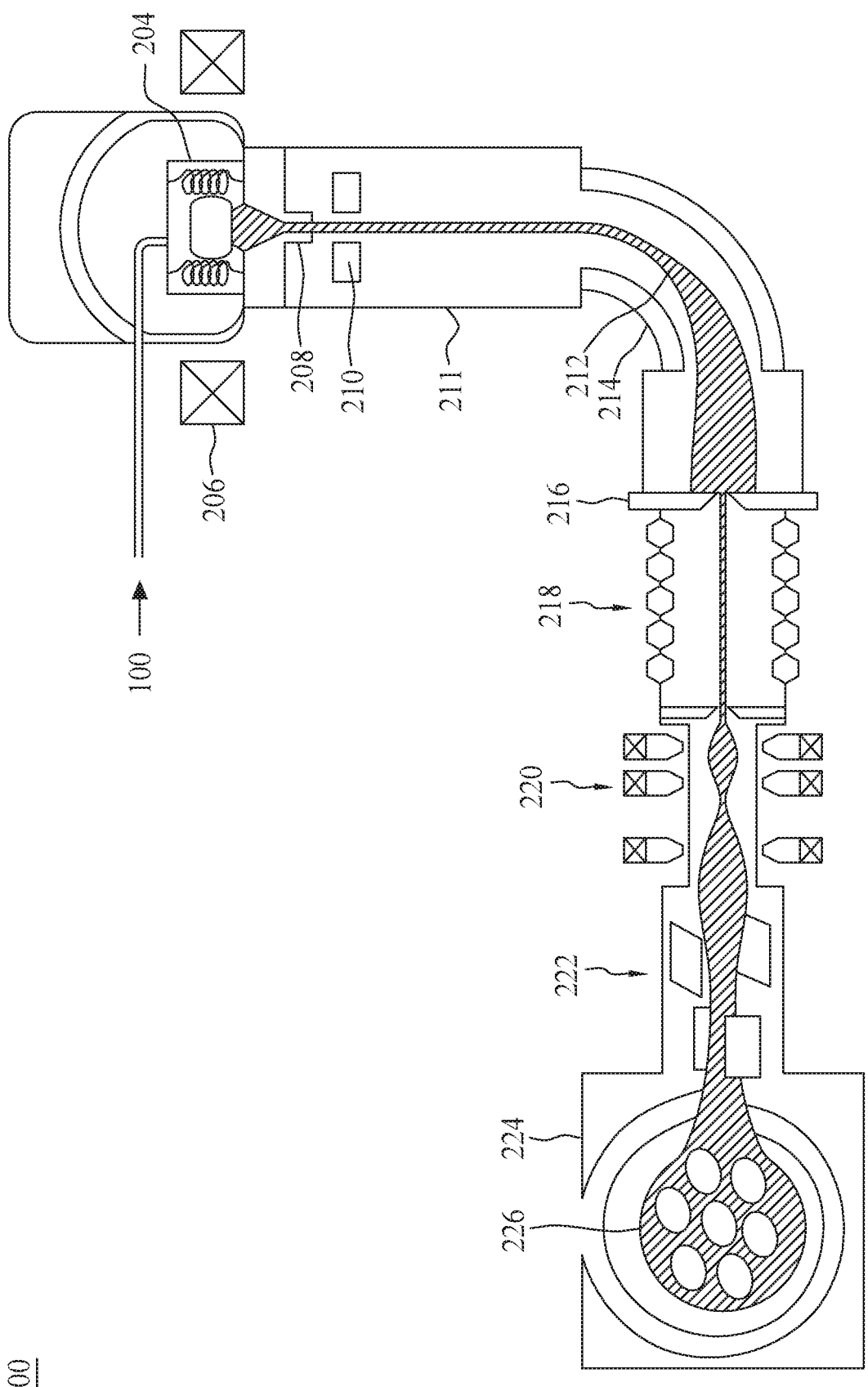
FIG. 2 is an ion implanter used for applying the PAI in a semiconductor structure in accordance with some embodiments of the present disclosure.

FIG. 2 is an ion implanter 200 in accordance with some embodiments of the present disclosure. As the trend in the semiconductor industry is toward smaller, higher speed devices, both the lateral dimensions and the depths of features in semiconductor devices are decreasing. An ion implanter is a powerful tool to achieve the requirements by modifying the electronic properties of a substrate, such as a wafer. The concentration profile of the impurity can be precisely controlled with ion current, ion energy and implantation time. In pursuit of higher device density, the ion implanter 200 can be implemented to introduce conductivity-altering solid materials into semiconductor wafers. In some embodiments of the present disclosure, the ion implanter 200 is used to apply not only the standard implant but also the PAI to a semiconductor structure.

Referring to FIG. 2, the ion implanter 200 is deployed in the process after the heating system 100 illustrated in FIG. 1B. After the heating system 100 processes a solid material, such as Gallium compound, to produce a gaseous substance, the ion implanter 200 extracts the gaseous substance from the heating system 100 and further heats the gaseous substance. The ionizing chamber 204 is an ion source given a high voltage to creates atomic and molecular ions. In some embodiments of the present disclosure, ions can be created in an inductively coupled plasma, which is a plasma source in which the energy is supplied by electrical currents which are produced by electromagnetic induction.

After the temperature of the solid material increases over a vaporization temperature or a sublimation temperature, ions are generated in the gaseous substance of the ionizing chamber 204. The ions are extracted by the electrodes 210 through a nozzle 208 in an ion extraction chamber 211. The electrodes 210 can also be used for the pre-acceleration of the ions.

The beam path 212 indicates a serial of treatments for the ions in the ion implanter 200. The beam path 212 turns in a curve affected by the analyzing magnet 214, and different ions in the beam path 212 have different curvature based on their mass. Thus, the ions in the curve can be selected via mass spectrometry by the mass analyzing slit 216 positioned to select the ions with the desired mass.

After the selective process, the ions may be accelerated in the acceleration column 218, and the ions can be accelerated to form an ion beam of prescribed energy. Optionally, the ion beam can be focused and controlled by the magnetic quadrupole lenses 220 with multiple electrodes and lens. The focused and controlled ion beam can pass through the electronic scan plates 222 with scanning spot beam fashion. Finally, the ion beam is directed at the surface of the semiconductor substrate 226 in an end station 224. The energetic ions in the beam path 212 penetrate into the bulk of the semiconductor structure of the semiconductor substrate 226 and are embedded into the crystalline lattice of the semiconductor structure. Thus, the ions can be implanted into the semiconductor structure of the semiconductor substrate 226. In some embodiments of the present disclosure, the semiconductor substrate 226 can be a target wafer, and the semiconductor structure can be a junction.

Along the beam path 212, the ions are generated, concentrated, accelerated dramatically and guided at high speed to the semiconductor structure of the semiconductor substrate 226 to modify material properties of the junction such as conductivity or crystal structure.

The implanted depth of the solid material is determined by the energy of the ions implanted into the semiconductor wafer. Normally, shallow junctions are obtained with low implant energies. Optionally, the ion implanter 200 is maintained at a good vacuum condition to preserve the purity of the source and prevent the ion scattering in the semiconductor substrate 200.

Figure 3:
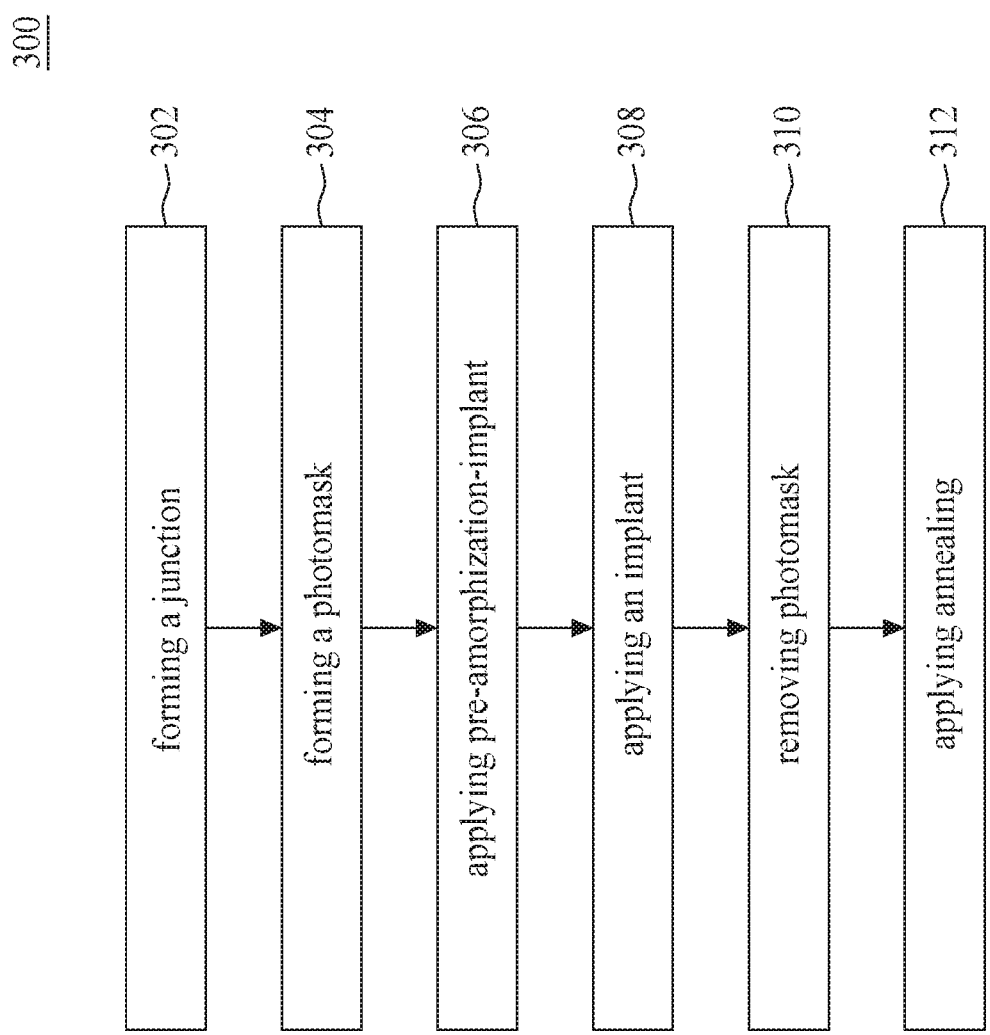
FIG. 3 is a flowchart illustrating a method for forming a semiconductor structure in accordance with some embodiments of the present disclosure.

FIG. 3 is a flowchart illustrating a method for forming a semiconductor structure in accordance with some embodiments of the present disclosure. The solid material, such as the Gallium compound, can be powder, lump or shot packed under Argon, and the solid material can serve as species of PAI and electrical dopant in Silicon Germanium substrate in a general condition in accordance with some embodiments of the present disclosure.

Referring to FIG. 3, after a junction of a well, a threshold voltage section, a channel, a Lightly Doped Drain, a Source/Drain, or a contact is formed in operation 302, a set of photomasks may be optionally formed on the substrate/wafer based on the requirement in operation 304. The substrate/wafer with photomasks, each defining a pattern layer in integrated circuit fabrication, is fed into a photolithography stepper or scanner, and the photomasks are individually selected for exposure. If applied in double patterning, a photomask would correspond to a subset of the layer pattern.

Then, the method for applying a PAI illustrated in FIG. 2 can be applied in an application area of the junction to modify the electronic properties of the application area of the junction in operation 306. For a junction of a P-type Lightly Doped Drain (PLDD)., the process of the PAI in operation 306 is implemented in an energy range in 1~40 KeV 1E14~5E15/$cm^2$. operation 306 will be further detailed based on FIG. 4 in the following.

After the operation of the PAI, a standard implant can be executed to produce Boron ions or Boron Difluoride ions and implant the Boron ions or Boron Difluoride to the application area, for example, the junction of the wafer, in operation 308. operation 308 will be further detailed based on FIG. 5 in the following.

Then, if photomasks are formed in operation 304, the photomasks can be removed in operation 310. Further, operation 312 is an optional process to execute an annealing treatment on the application area of the substrate. The annealing provides a heat treatment that alters the physical and chemical properties of the junction to increase the ductility and reduce its hardness, making it more workable. Further, the semiconductor wafer is annealed to activate the solid material and provide damage recovery.

Annealing involves heating the semiconductor wafer to a prescribed temperature for a prescribed time. The material of the junction is heated above its recrystallization temperature, maintaining a suitable temperature, and then cooling. In the annealing treatment, atoms of the junction migrate in the crystal lattice and the number of dislocations decreases, leading to a change in ductility and hardness. As the material cools it recrystallizes.

In the traditional method for forming a junction in a semiconductor structure, Germanium, Carbon and Silicon, which play no electrical role to contribute to electrical dopant based on the property of 4A group in periodic table, are implemented as PAI species to apply to the application areas including a well, a threshold voltage section, a channel, a Lightly Doped Drain, a Source/Drain, or a contact.

The well is an implanted or diffused region in a Silicon wafer to implement CMOS cell.

The threshold voltage section is a section for controlling threshold voltage. The threshold voltage is the gate voltage of a field-effect transistor (FET), and is the minimum gate-to-source voltage differential that is needed to create a conducting path between the source and drain terminals. In some embodiments of the present disclosure, the threshold voltage may be decided by the oxide thickness, and the threshold voltage section is the oxide layer.

The channel is a conductivity region connecting source and drain. The conductivity of channel can be controlled by a gate voltage, and the channel conductivity can be low by turning channel "close" and can be high by turning channel "open".

The Lightly Doped Drain (LDD) is the drain region with reduced doping in a small geometry MOS/CMOS transistor. The reduced doping gradient between drain and channel can reduce electric field in the channel near the drain.

The source is one of three terminals located at one end of the channel in Field Effect Transistors. Further, the source is a doped region. The majority carriers are flowing from the source to the channel.

The drain is one of three terminals located at one end of the channel in Field Effect Transistors. Further, the drain is a doped region. The majority carriers are flowing out of the transistor through the drain.

Figure 4:
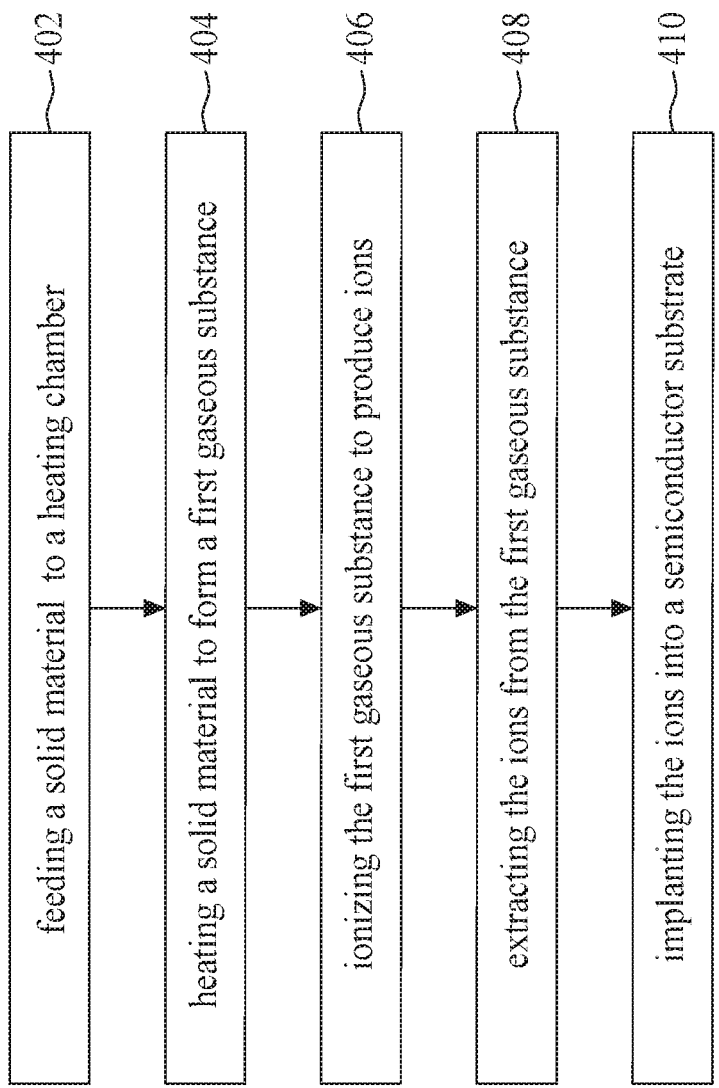
FIG. 4 is a flowchart illustrating a method for applying a PAI in a semiconductor structure in accordance with some embodiments of the present disclosure.

FIG. 4 is a flowchart illustrating a method for applying a PAI in a semiconductor structure in accordance with some embodiments of the present disclosure. Referring to FIGS. 2 and 3, a solid material 104, such as the Gallium compound, is fed into a heating chamber 110 ins operation 402.

In operation 404, the solid material 104 is heated in the heating chamber 110 to produce the first gaseous substance. A heating controller of the heating chamber 110 controls a generated rate of the first gaseous substance by controlling a first temperature and a first pressure of the heating chamber 110. After the temperature of the solid material 104 increases over a temperature, the first gaseous substance of the solid material 104 is generated in the heating chamber 110. In some embodiments of the disclosure, the operation temperature of the heating chamber 110 could be a vaporization temperature or a sublimation temperature of the solid material 104, and is 150~170° C. at pressure about 1E-5 torr for Gallium Iodide ($GaI_3$). After the first gaseous substance of the solid material 104 is generated, the first gaseous substance of the solid material 104 is transferred to the ionizing chamber 204. The first gaseous substance, such as the gaseous Gallium compound, can be extracted from the heating chamber 110 and introduced into the ionizing chamber 204.

In operation 406, the first gaseous substance is further heated in the ionizing chamber 204, and ions, such as the Gallium ions, are generated in the ionizing chamber 204 to serve as the dopant ions. Then, the first gaseous substance with the ions is transferred to an ion extraction chamber 211.

In operation 408, the ions are extracted by the electrodes 210 through a nozzle 208 in an ion extraction chamber 211. The electrodes 210 can also be used for the pre-acceleration of the ions. Along the beam path 212 of the ions in the ion implanter 200, the different ions turn in different curves affected by the analyzing magnet 214, and ions can be selected via mass spectrometry by the mass analyzing slit 216 positioned to select the ions with the desired mass.

In operation 410, the ions are implanted to an application area in the semiconductor structure of the substrate. Optionally, the substrate can be the Silicon Germanium material. The ions may be accelerated in the acceleration column 218, and the ions can be accelerated to form an ion beam of prescribed energy. Optionally, the ion beam can be focused and controlled by the magnetic quadrupole lenses 220 with multiple electrodes and lens. The focused and controlled ion beam can pass through the electronic scan plates 222 with scanning spot beam fashion. Finally, the ion beam is directed at the surface of the semiconductor substrate 226 in an end station 224.

Figure 5:
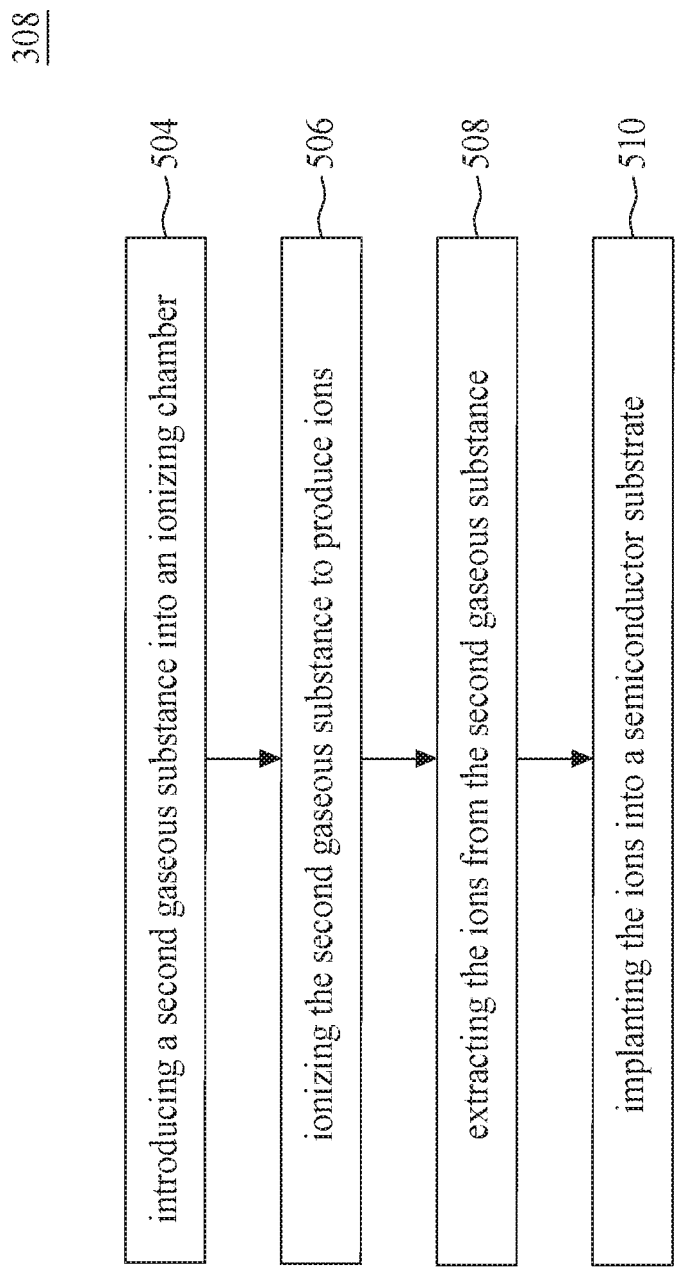
FIG. 5 is a flowchart illustrating a method for applying an implant in a semiconductor structure in accordance with some embodiments of the present disclosure.

FIG. 5 is a flowchart illustrating a method for applying an implant in a semiconductor structure in accordance with some embodiments of the present disclosure.

In operation 504, a second gaseous substance is introduced into the ionizing chamber 204. The second gaseous substance is not processed by the heating chamber 110 because the second gaseous substance is in the gaseous state in the normal temperature and pressure.

In operation 506, the second gaseous substance is heated in the ionizing chamber 204, and ions, such as the Boron ions, are generated in the ionizing chamber 204 to serve as the dopant ions. Then, the second gaseous substance with the ions is transferred to an ion extraction chamber 211.

In operation 508, the ions are extracted by the electrodes 210 through a nozzle 208 in an ion extraction chamber 211. The electrodes 210 can also be used for the pre-acceleration of the ions. Along the beam path 212 of the ions in the ion implanter 200, the different ions turn in different curves affected by the analyzing magnet 214, and ions can be selected via mass spectrometry by the mass analyzing slit 216 positioned to select the ions with the desired mass.

In operation 510, the ions are implanted to an application area in the semiconductor structure of the substrate. The ions may be accelerated in the acceleration column 218, and the ions can be accelerated to form an ion beam of prescribed energy. Optionally, the ion beam can be focused and controlled by the magnetic quadrupole lenses 220 with multiple electrodes and lens. The focused and controlled ion beam can pass through the electronic scan plates 222 with scanning spot beam fashion. Finally, the ion beam is directed at the surface of the semiconductor substrate 226 in an end station 224.

The advantageous effects achieved by the present disclosure have been proved providing the better abruptness, the better shallow junction depth, and the better sheet resistance. The experimental data will be detailed and analyzed on the basis of the following table and charts.

Table 1 lists data of the junction depth, the abruptness, and the resistance in two Germanium concentration conditions with or without the treatment that Gallium compound serves as species of PAI for a P-type Lightly Doped Drain (PLDD). On the basis of the experimental data listed in Table 1, Gallium is found to be suitable to serve as PAI species and electrical dopant in the Silicon Germanium (SiGe) substrate.

TABLE 1

| Condition No. | | 1 | | 2 |
| --- | --- | --- | --- | --- |
| 1 Germanium concentration | | 25% | | 40% |
| 2 Ga PAI treatment | No | Yes | No | Yes |
| 3 Junction depth | $Xj_1$ | 0.53 $Xj_1$ | $Xj_2$ | 0.58 $Xj_2$ |
| 4 Abruptness | $Ab_1$ | 0.55 $Ab_1$ | $Ab_2$ | 0.51 $Ab_2$ |
| 5 Resistance | $R_1$ | 0.93 $R_1$ | $R_2$ | 0.96 $R_2$ |

Referring to the experimental data of Table 1 shown in the above, in a first controlled condition that the Germanium concentration of the Silicon Germanium substrate is 25%, while the junction depth, the abruptness, and the resistance of the Silicon Germanium substrate without the treatment that the Gallium compound serves as species of PAI are measured $Xj_1$, $Ab_1$, and $R_1$, respectively, the junction depth, the abruptness, and the resistance of the Silicon Germanium substrate with the treatment that the Gallium compound serves as species of PAI are measured 0.53 $Xj_1$, 0.55 $Ab_1$, and 0.93 $R_1$, respectively. Therefore, the first condition of the experimental data of Table 1 shows that the Silicon Germanium substrate with the treatment that the Gallium compound serves as species of PAI can possess better features or properties than the Silicon Germanium substrate without the treatment that the Gallium compound serves as species of PAI.

Still referring to the experimental data of Table 1 shown in the above, in a second controlled condition that the Germanium concentration of the Silicon Germanium substrate is 40%, while the junction depth, the abruptness, and the resistance of the Silicon Germanium substrate without the treatment that the Gallium compound serves as species of PAI are measured $Xj_2$, $Ab_2$, and $R_2$, respectively, the junction depth, the abruptness, and the resistance of the Silicon Germanium substrate with the treatment that the Gallium compound serves as species of PAI are measured 0.58 $Xj_2$, 0.51 $Ab_2$, and 0.96 $R_2$, respectively. Therefore, the second condition of the experimental data of Table 1 also shows that the Silicon Germanium substrate with the treatment that the Gallium compound serves as species of PAI can possess better features or properties than the Silicon Germanium substrate without the treatment that the Gallium compound serves as species of PAI.

On the basis of the first and second conditions of the experimental data of Table 1, the Silicon Germanium substrate is provided with better abruptness, better shallow junction depth, and better sheet resistance while the Gallium compound serves as species of PAI and electrical dopant on the Silicon Germanium substrate. Moreover, if the Gallium compound serves as electrical dopant, the semiconductor structure can possess lower resistance even the total dopant increases to $6E15/cm^3$.

Figure 6:
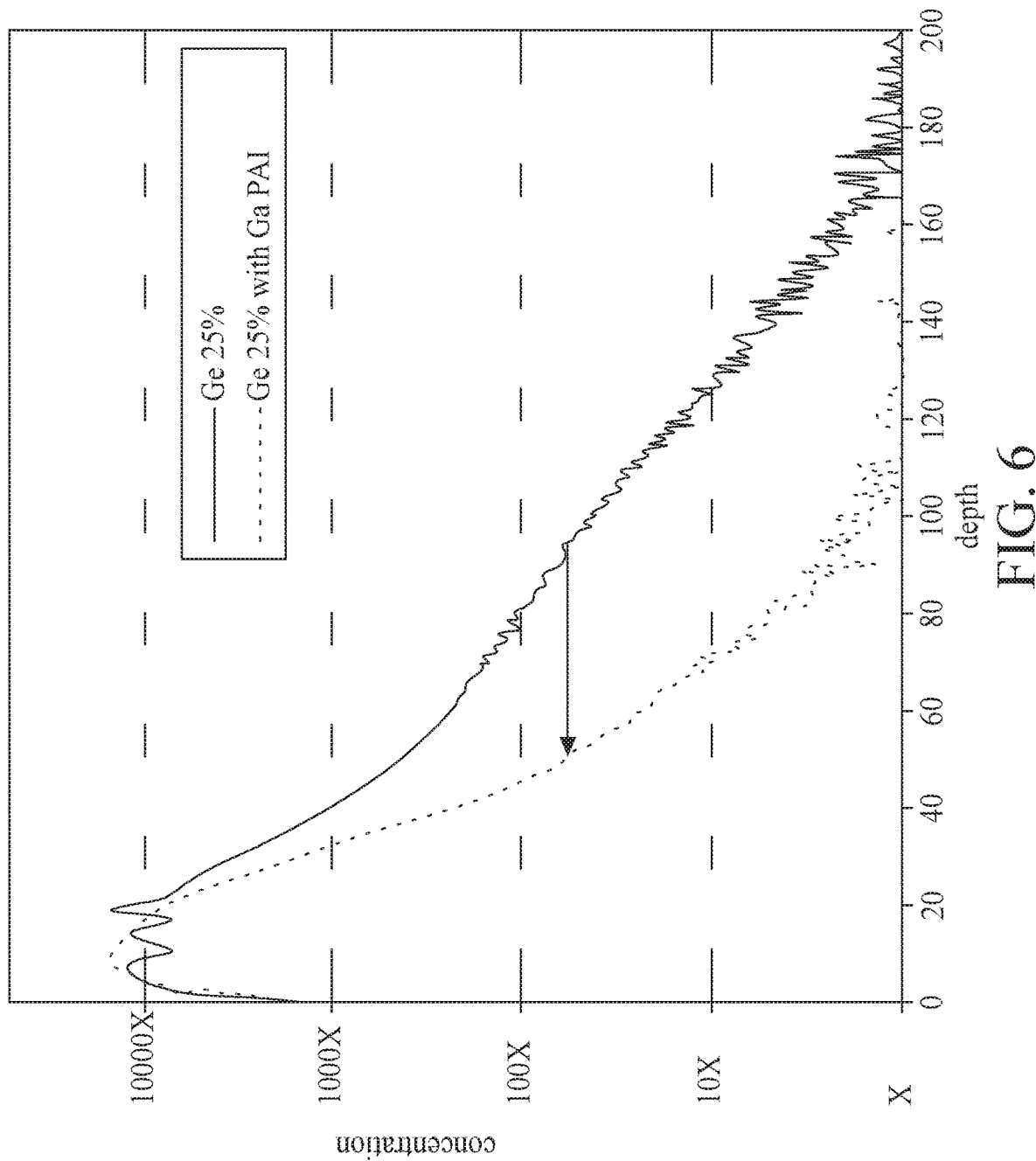
FIG. 6 is a chart illustrating the effect that the Gallium compound serves as species of PAI for a PLDD of a semiconductor structure while Germanium concentration of the junction of Silicon Germanium substrate is 25%.
Figure 7:
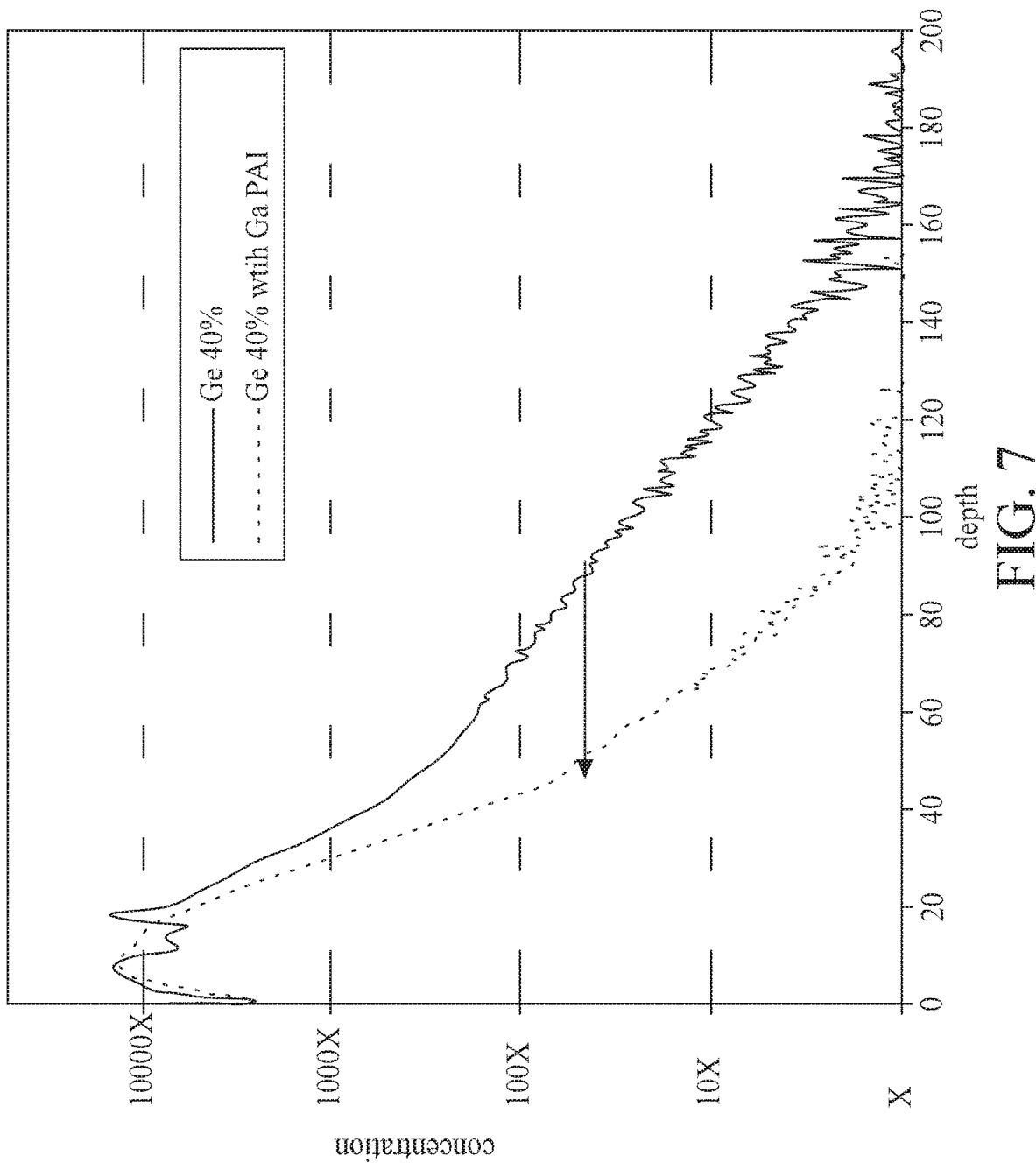
FIG. 7 is a chart illustrating the effect that the Gallium compound serves as species of PAI for a PLDD of a semiconductor structure while Germanium concentration of the junction of Silicon Germanium substrate is 40%.
Figure 8:
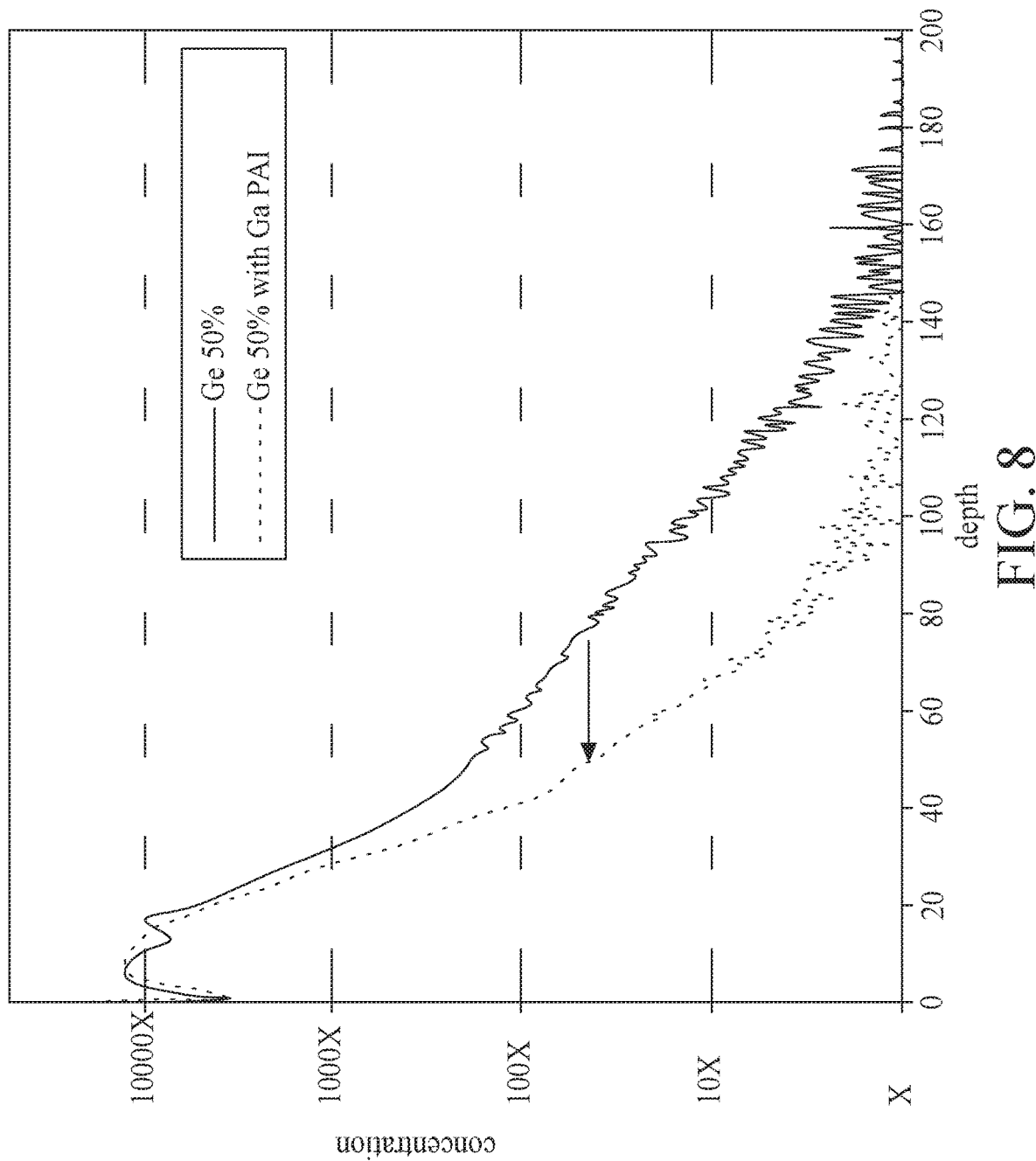
FIG. 8 is a chart illustrating the effect that the Gallium compound serves as species of PAI for a PLDD of a semiconductor structure while Germanium concentration of the junction of Silicon Germanium substrate is 50%.

FIGS. 6 to 8 are the charts providing more experimental data to prove the reduction of junction depth achieved by the treatment that the Gallium compound serves as species of PAI for a P-type Lightly Doped Drain (PLDD).

FIG. 6 is a chart illustrating the effect that the Gallium compound serves as species of PAI for the P-type Lightly Doped Drain of a semiconductor structure while the Germanium concentration of the Silicon Germanium substrate is 25%. FIG. 6 shows the boron profiles, and the arrow denotes the reduction of the junction depth from the treatment without the Gallium compound serving as species of PAI represented by the solid line in the end of the arrow to the treatment with the Gallium compound serving as species of PAI represented by the dot line in the head of the arrow. On the basis of the chart of FIG. 6, basically, the junction depth will be reduced if the semiconductor structure is processed by the treatment that the Gallium compound serves as species of PAI for the P-type Lightly Doped Drain.

FIG. 7 is a chart illustrating the effect that the Gallium compound serves as species of PAI for the P-type Lightly Doped Drain of a semiconductor structure while the Germanium concentration of the Silicon Germanium substrate is 40%. FIG. 7 shows the boron profiles, and the arrow denotes the reduction of the junction depth from the treatment without the Gallium compound serving as species of PAI represented by the solid line in the end of the arrow to the treatment with the Gallium compound serving as species of PAI represented by the dot line in the head of the arrow. On the basis of the chart of FIG. 7, basically, the junction depth will be reduced if the semiconductor structure is processed by the treatment that the Gallium compound serves as species of PAI for the P-type Lightly Doped Drain.

FIG. 8 is a chart illustrating the effect that the Gallium compound serves as species of PAI for the P-type Lightly Doped Drain of a semiconductor structure while the Germanium concentration of the Silicon Germanium substrate is 50%. FIG. 8 shows the boron profiles, and the arrow denotes the reduction of the junction depth from the treatment without the Gallium compound serving as species of PAI represented by the solid line in the end of the arrow to the treatment with the Gallium compound serving as species of PAI represented by the dot line in the head of the arrow. On the basis of the chart of FIG. 8, basically, the junction depth will be reduced if the semiconductor structure is processed by the treatment that the Gallium compound serves as species of PAI for the P-type Lightly Doped Drain.

To sum up, the charts of FIGS. 6 to 8 with the experimental data can prove that the treatment with the Gallium compound serving as species of PAI for the P-type Lightly Doped Drain can achieve the advantages of the reduction of the junction depth.

Based on the above-mentioned disclosure, Gallium can serve as new solid source, and achieves many advantages. For example, Gallium Iodide can be used to implement into mass production of the 5-nanometer (Nano-5) technology due to abruptness improvement, and Gallium is suitable for Silicon Germanium substrate which is 5-nanometer channel or 5-nanometer Source/Drain material.

Moreover, the new solid source Gallium can be further expected to improve short channel effect, Device Drain-Induced Barrier Lowering (DIBL) effect, and, etc. while the semiconductor devices of the modern semiconductor industry are scaling down with the decreased lateral dimensions and the decreased depths of features.

The short channel effect occurs while the channel length of MOSFETs is comparable to the depletion-layer widths of the source and drain junctions. The short channel effect may result in the Drain-Induced Barrier Lowering, velocity saturation, and hot carrier degradation.

The Device Drain-Induced Barrier Lowering effect is a parasitic short-channel effect in MOSFETs. The Device Drain-Induced Barrier Lowering may result in reduced control of the gate voltage over the current of the transistor, and affect the threshold voltage of the transistor.

Therefore, the Gallium compound can serve as species of PAI and electrical dopant on PLDD of Silicon Germanium substrate to achieve better abruptness, better shallow junction depth, and better sheet resistance in a junction of the PLDD of Silicon Germanium substrate. Thus, the better device performance due to above advantage in a junction of the PLDD of Silicon Germanium substrate can be expected.

Therefore, the Gallium compound can serve as species of PAI and electrical dopant in Silicon Germanium substrate in a general condition to achieve better abruptness, better shallow junction depth, and better sheet resistance in a junction of a well, a threshold voltage section, a channel, a Lightly Doped Drain, a Source/Drain, or a contact. Thus, due to above advantage, the better device performance in the general condition can be expected.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    providing a silicon germanium substrate;
    forming a junction region in the silicon germanium substrate;
    heating a solid material to form a gaseous substance, comprising heating the solid material to a temperature over 150~170° C. at a pressure about 1E-5 torr;
    ionizing the gaseous substance to produce a first type of ions;
    performing a pre-amorphization implantation (PAI) comprising implanting the first type of ions into the junction region;
    implanting boron ions into the junction region subsequent to implanting the first type of ions; and
    annealing the junction region implanted by the first type of ions and the boron ions.

2. The method of claim 1, wherein heating the solid material to form the gaseous substance is performed in a first chamber and comprises controlling a generated rate of the gaseous substance by controlling a temperature and a pressure of the first chamber.

3. The method of claim 1, further comprising transferring the gaseous substance to a second chamber after heating the solid material to form the gaseous substance, wherein ionizing the gaseous substance to produce the first type of ions is performed in the second chamber.

4. The method of claim 1, further comprising transferring the gaseous substance with the first type of ions to a third chamber after ionizing the gaseous substance to produce the first type of ions.

5. The method of claim 4, further comprising extracting the first type of ions from the gaseous substance in the third chamber.

6. The method of claim 1, further comprising accelerating the first type of ions in a fourth chamber.

7. The method of claim 1, wherein implanting the first type of ions in an energy range in 1~40 KeV 1E14~5E15/$cm^2$.

8. The method of claim 1, further comprising: forming a mask on the substrate prior to implanting the first type of ions.

9. The method of claim 8, further comprising removing the mask prior to annealing the junction region.

10. A method for forming a semiconductor structure, comprising:
    heating a solid material to a temperature greater than 150° C. at a pressure about 1E-5 torr to form a first gaseous substance, wherein the solid material comprises gallium;
    transferring the first gaseous substance into an ionizing chamber;
    ionizing the first gaseous substance to produce a first type of ions;
    implanting the first type of ions into a semiconductor substrate;
    introducing a second gaseous substance into the ionizing chamber subsequent to implanting the first type of ions, wherein the second gaseous substance comprises boron;
    ionizing the second gaseous substance to produce a second type of ions; and
    implanting the second type of ions into the semiconductor substrate.

11. The method of claim 10, wherein heating the solid material to form the first gaseous substance is performed in a first chamber and comprises controlling a generated rate of the first gaseous substance by controlling a temperature and a pressure of the first chamber.

12. The method of claim 10, wherein ionizing the first gaseous substance to produce the first type of ions and ionizing the second gaseous substance to produce the second type of ions are performed in a second chamber, wherein the semiconductor substrate is a silicon germanium substrate.

13. The method of claim 10, wherein
    ionizing the first gaseous substance to produce the first type of ions further comprises extracting the first type of ions from the first gaseous substance in a third chamber; and
    ionizing the second gaseous substance to produce the second type of ions further comprises extracting the second type of ions from the second gaseous substance in the third chamber.

14. The method of claim 13, further comprising:
    accelerating the first type of ions in a fourth chamber; and
    accelerating the second type of ions in the fourth chamber.

15. The method of claim 14, wherein implanting the first type of ions in an energy range in 1~40 KeV 1E14~5E15/$cm^2$.

16. The method of claim 10, wherein the solid material comprises gallium iodide.

17. A method for forming a semiconductor structure, comprising:
    providing a gallium-containing gas;
    heating the gallium-containing gas to a temperature over 150~170° C. at a pressure about 1E-5 torr;
    ionizing the gallium-containing gas to produce a plurality of ions; and
    implanting the plurality of ions into a semiconductor substrate.

18. The method of claim 17, wherein the implantation of the plurality of ions is in an energy range in 1~40 KeV 1E14~5E15/$cm^2$.

19. The method of claim 17, further comprising extracting the plurality of ions from the gallium-containing gas.

20. The method of claim 17, further comprising accelerating the plurality of ions.

* * * * *